(12) United States Patent
Park

(10) Patent No.: US 6,984,562 B2
(45) Date of Patent: Jan. 10, 2006

(54) METHOD FOR FORMING DIELECTRIC LAYER BETWEEN GATES IN FLASH MEMORY DEVICE

(75) Inventor: Sang Wook Park, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 9 days.

(21) Appl. No.: 10/879,680

(22) Filed: Jun. 29, 2004

(65) Prior Publication Data

US 2005/0233521 A1    Oct. 20, 2005

(30) Foreign Application Priority Data

Apr. 20, 2004  (KR) ................ 10-2004-0027109

(51) Int. Cl.
*H01L 21/336*    (2006.01)

(52) U.S. Cl. ............... 438/257; 438/258; 438/593

(58) Field of Classification Search ............. None
See application file for complete search history.

(56) References Cited

U.S. PATENT DOCUMENTS 5,571,734 A  * 11/1996 Tseng et al. ............. 438/591

\* cited by examiner

*Primary Examiner*—Dung A. Le
(74) *Attorney, Agent, or Firm*—Marshall, Gerstein & Borun LLP

(57) ABSTRACT

The present invention provides a method for preventing an oxide film from becoming thick due to the reaction of the oxide film and a floating gate in a method for manufacturing a flash memory device having a dielectric layer consisting of at least one oxide film between the floating gate and a control gate. To this end, a Si—F bonding layer is formed on the surface of a silicon film constituting the floating gate. The Si—F bonding layer is annealed in a nitrogen gas atmosphere to form a Si—N bonding layer. A dielectric layer is then formed.

15 Claims, 6 Drawing Sheets

METHOD FOR FORMING DIELECTRIC LAYER BETWEEN GATES IN FLASH MEMORY DEVICE

BACKGROUND

1. Field of the Invention

The present invention relates to a method for manufacturing a flash memory device, and more specifically, to a method for forming a dielectric layer between gates in a flash memory device.

2. Discussion of Related Art

Programming and erasing operations in a flash memory device are accomplished by storing or erasing charges in or from a floating gate. The programming and erasing properties are dependent on the coupling ratio between the floating gate and the control gate. It is thus necessary to form a dielectric layer between the floating gate and the control gate in a uniform thickness.

A conventional method for manufacturing a flash memory device will be described with reference to FIG. 1.

A gate pattern G consisting of a tunnel oxide film 11, a floating gate 12, an ONO dielectric layer 13 and a control gate 14 is formed on a semiconductor substrate 10. An impurity is doped into the semiconductor substrate 10 to form source/drain 15. The floating gate 12 is formed using a doped silicon film and the ONO dielectric layer 13 is formed by stacking a lower oxide film ONO1, a nitride film ONO2 and an upper oxide film ONO3.

If the flash memory device is fabricated by means of the aforementioned method, the floating gate 12 and the lower oxide film ONO1 formed of silicon react each other in the annealing process. Accordingly, re-oxidization occurs, which results in a thick lower oxide film ONO1. For example, a thickness "t1" of the lower oxide film ONO1 before the annealing process is increased to a thickness of "t2". Such re-oxidization is more active at the edges of the lower oxide film ONO1, resulting in the bird's beak that the edges are relatively thick. As the thickness of the lower oxide film ONO1 is increased, the coupling ratio between the floating gate 12 and the control gate 14 is lowered. Moreover, since the thickness of the lower oxide film ONO1 is not uniformly increased over the entire wafer, there is a problem that the yield is lowered due to increased dispersion of the threshold voltage at the time of the programming and erasing operations of the device.

SUMMARY OF THE INVENTION

The present invention is directed to a method for forming a dielectric layer between gates in a flash memory device that can prohibit reaction of a floating gate and an oxide film to prevent variation in a thickness of the dielectric layer.

In order to accomplish the object, in a method for manufacturing a flash memory device having a dielectric layer consisting of at least one oxide film between a floating gate and a control gate, the present invention provides a method for preventing the oxide film from becoming thick due to the reaction of the oxide film and the floating gate. To this end, a Si—F bonding layer is formed on the surface of a silicon film constituting the floating gate. The Si—F bonding layer is annealed in a nitrogen gas atmosphere to form a Si—N bonding layer. A dielectric layer is then formed.

According to an aspect of the present invention, there is provided a method of manufacturing a flash memory device, comprising the steps of forming a silicon film pattern constituting a floating gate; forming a silicon-fluorine (Si—F) bonding layer on the surface of the silicon film pattern in an atmosphere that fluorine is supplied; performing an annealing process in a nitrogen atmosphere to form a silicon-nitrogen (Si—N) bonding layer on the surface of the silicon film pattern; forming a dielectric layer having at least one oxide film on the silicon film pattern having the Si—N bonding layer; and forming a conductive film for forming a control gate on the dielectric layer.

According to another aspect of the present invention, there is provided a method of manufacturing a flash memory device, comprising the steps of forming a silicon film for forming a floating gate; forming a silicon-fluorine (Si—F) bonding layer on the surface of the silicon film in an atmosphere that fluorine is supplied; performing an annealing process in a nitrogen atmosphere to form a silicon-nitrogen (Si—N) bonding layer on the surface of the silicon film; forming a dielectric layer having at least one oxide film on the silicon film having the Si—N bonding layer; forming a conductive film for forming a control gate on the dielectric layer; and patterning the silicon film having the conductive film, the dielectric layer and the Si—N bonding layer.

According to still another embodiment of the present invention, there is provided a method of manufacturing a flash memory device, comprising the steps of forming a silicon film pattern constituting a floating gate; performing a cleaning process using HF to form a Si—F bonding layer on the surface of the silicon film pattern; performing an annealing process in a $NH_3$ gas atmosphere to form a Si—N bonding layer on the surface of the silicon film pattern; stacking a lower oxide film, a nitride film and an upper oxide film on the silicon film pattern having the Si—N bonding layer, forming a dielectric layer; and forming a control gate on the dielectric layer.

DETAILED DESCRIPTION OF PREFERRED EMBODIMENTS

Figure 1:
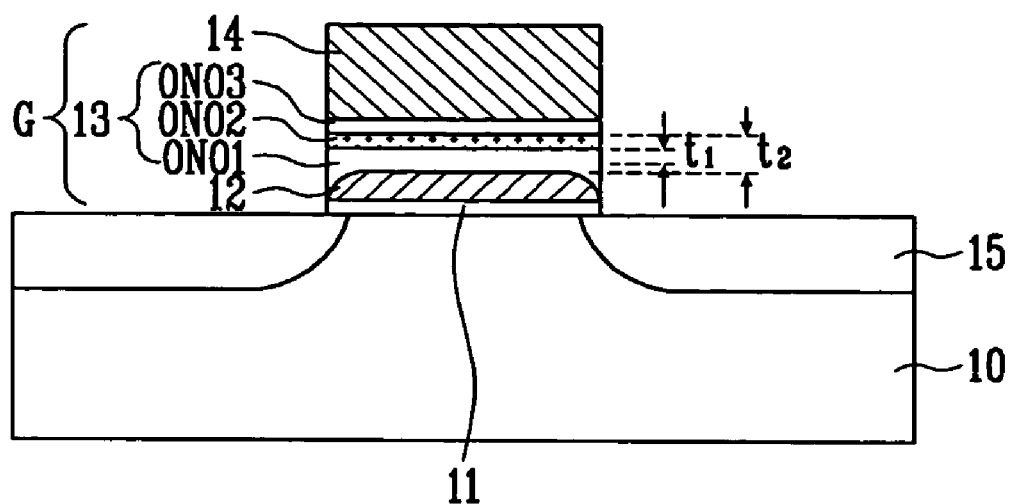
FIG. 1 is a cross-sectional view illustrating a gate pattern of a flash memory device formed in the related art.

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Further, in the drawing, the thickness and size of each layer are exaggerated for convenience of explanation and clarity. Like reference numerals are used to identify the same or similar parts. Meanwhile, in case where it is described that one film is "on" the other film or a semiconductor substrate, the one film may directly contact the other film or the semiconductor substrate. Or, a third film may be intervened between the one film and the other film or the semiconductor substrate.

A method for manufacturing a flash memory device according to an embodiment of the present invention will be described with reference to FIG. 2A to FIG. 2H.

Figure 2A:
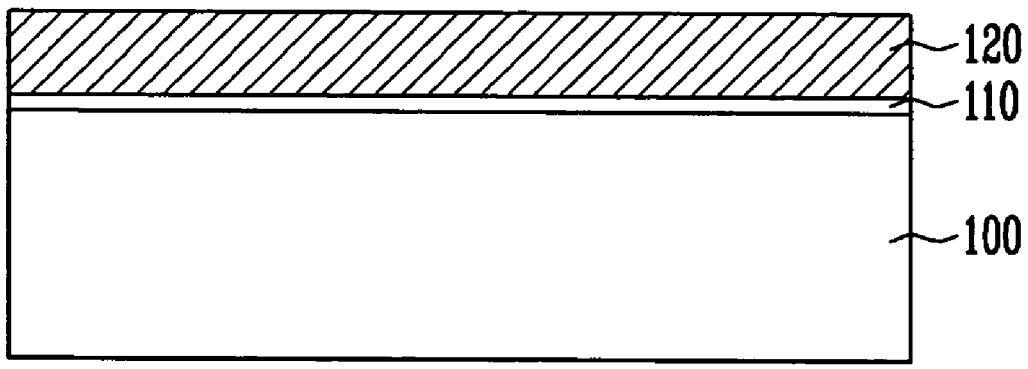
FIG. 2A to FIG. 2H are cross-sectional views shown to explain a method for manufacturing a flash memory device according to an embodiment of the present invention.

Referring to FIG. 2A, a tunnel oxide film 110 and a silicon film 120 for a floating gate are sequentially formed on a semiconductor substrate 100. The silicon film 120 can be formed using an amorphous silicon film. The silicon film 120 can be formed in thickness of 300 Å to 500 Å. The silicon film 120 can be doped with P having a concentration of 2.1E21/cm² to 5E21/cm². P can be doped in the deposition process for forming the silicon film 120, or can be doped through ion implantation performed after the silicon film 120 is deposited.

Figure 2B:
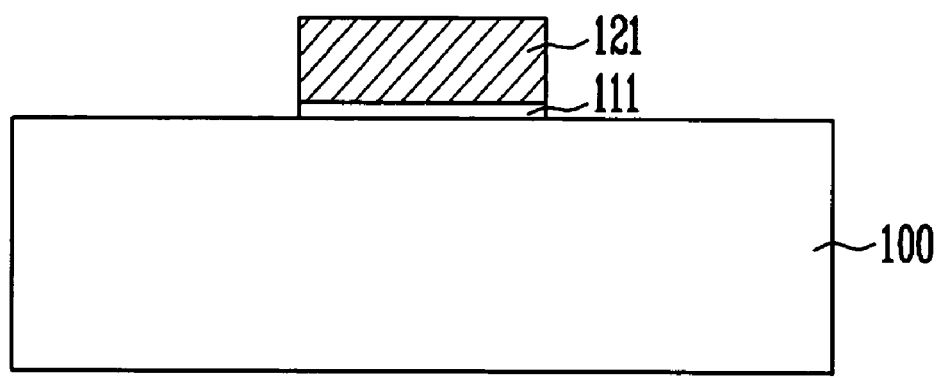

The silicon film 120 is then patterned to form a silicon film pattern 121, as shown in FIG. 2B. The silicon film pattern 121 can be formed by forming an etch mask (not shown) that defines a floating gate and then selectively etching the silicon film 120. In the process of forming the silicon film pattern 121, the tunnel oxide film 110 may be also etched to form a tunnel oxide film pattern 111.

Thereafter, the etch mask is stripped and a post etch cleaning process for stripping the etch remnant is carried out.

The post etch cleaning process can be performed in several processes as follows. That is, piranha cleaning using a mixed solution of $H_2SO_4$, $H_2O_2$ and $H_2O$ is performed. Cleaning using buffered oxide etchant (BOE) in which $NH_4F$ and HF are mixed in the ratio of 300:1 is then carried out. Next, SC-1 using a mixed solution of $NH_4OH$, $H_2O_2$ and $H_2O$ is performed at a temperature of 25° C. for 10 minutes. Meanwhile, in order to prevent the silicon film pattern 121 from collapsing, the post etch cleaning process is performed with megasonic energy not supplied thereto.

Figure 2C:
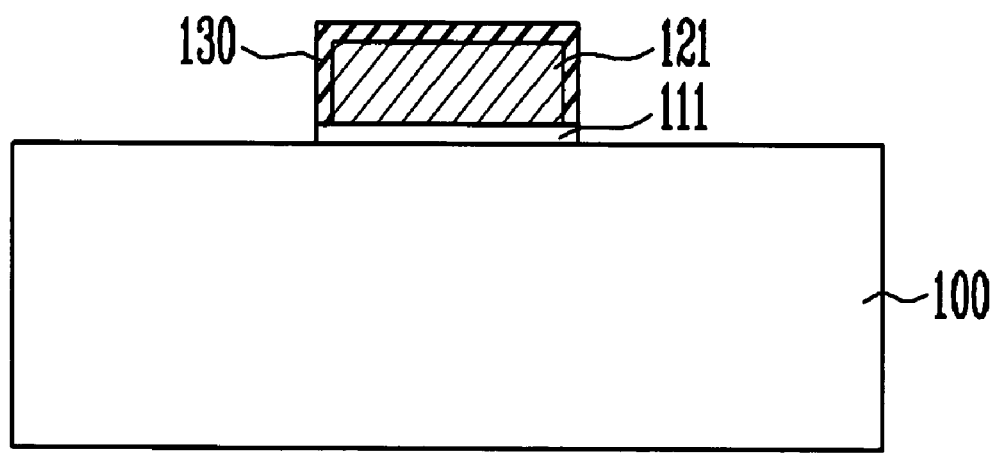

Next, as shown in FIG. 2C, in an atmosphere that fluorine is supplied, a silicon-fluorine (Si—F) bonding layer 130 is formed on the surface of the silicon film pattern 121. The formation of the Si—F bonding layer 130 can prevent a native oxide film from being formed. The Si—F bonding layer 130 can be formed by means of a cleaning process using a HF solution. The cleaning process using the HF solution in which H and F are mixed in the ratio of 40:1 to 60:1 can be performed for 10 seconds to 30 seconds to form the Si—F bonding layer 130 having a thickness of 3 Å to 5 Å. After the cleaning process using the HF solution is performed, a rinsing process can be performed. The rinsing process can be performed using de-ionized (DI) water of about 75° C. in a QDR (quick-dump rinse) and over flow mode. By performing these HF cleaning and rinsing processes, it is possible to lower the adsorption force of particles.

Thereafter, within 2 hours after the Si—F bonding layer 130 is formed, the semiconductor substrate 100 is moved into a reaction chamber. At this time, the semiconductor substrate 100 can be introduced into a loading chamber and then moved into the reaction chamber connected to the loading chamber. In order to prohibit generation of the native oxide film, the semiconductor substrate 100 can be moved from the loading chamber to the reaction chamber in a state where $N_2$ gas of 2 slm to 4.5 slm is supplied at a temperature of 400° C. to 500° C. and the pressure of 2 mTorr to 3 mTorr is maintained.

Figure 2D:
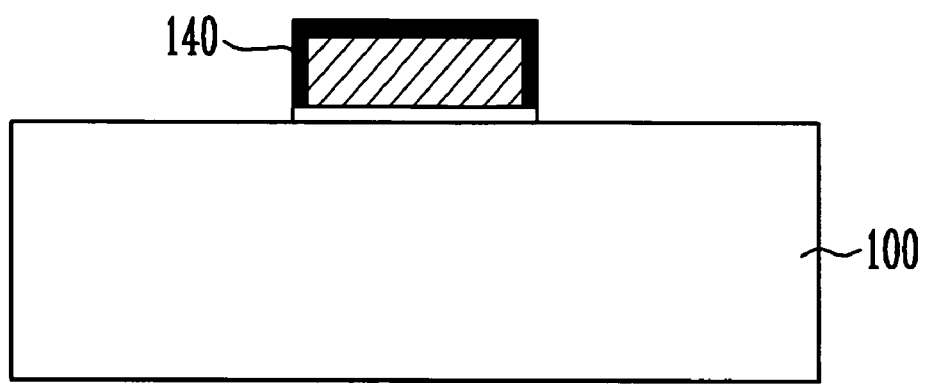

As shown in FIG. 2D, an annealing process is performed in a nitrogen atmosphere to form a silicon-nitrogen (Si—N) bonding layer 140 on the surface of the silicon film pattern. The annealing process can be performed under the condition that $NH_3$ gas of 5 slm to 7 slm is supplied to the reaction chamber at a temperature of 650° C. to 800° C. and a pressure of 2 mTorr to 5.5 mTorr. Further, the annealing process can be formed for 22 to 28 minutes, forming the Si—N bonding layer 140 having a thickness of 10 Å to 15 Å.

The Si—N bonding layer 140 can be formed by substituting fluorine with nitrogen in the Si—F bonding of the Si—F bonding layer 130. Since free energy required in bonding generation of Si—F is higher than free energy necessary for bonding generation of Si—N, the Si—F bonding is selectively generated according to the following Equation 1.

[Reaction Equation 1]

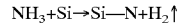

$$NH_3 + Si \rightarrow Si-N + H_2 \uparrow$$

Figure 2E:
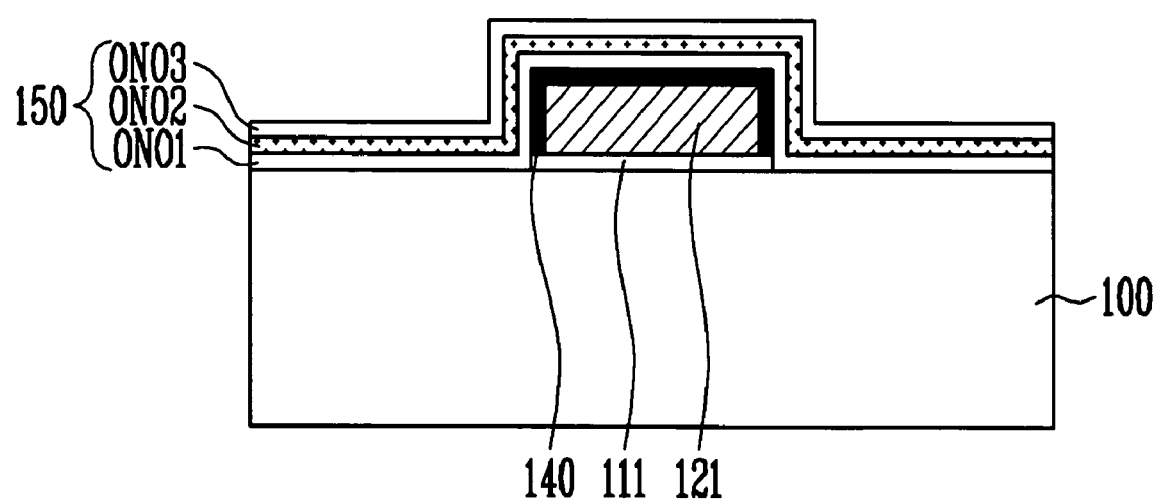

As shown in FIG. 2E, a dielectric layer 150 having at least one oxide film is formed on the silicon film pattern 121 having the Si—N bonding layer 140. The Si—N bonding layer 140 and the dielectric layer 150 can be formed in-situ.

According to an embodiment of the present invention, the dielectric layer 150 can be formed by sequentially stacking a lower oxide film ONO1, a nitride film ONO2 and an upper oxide film ONO3. The lower oxide film ONO1 and the upper oxide film ONO3 can be formed by supplying $SiH_2Cl_2$ of 2 slm to 4 slm and $N_2O$ of 1.5 slm to 2 slm by means of a high temperature oxide (HTO) method. The lower oxide film ONO1 and the upper oxide film ONO3 can be formed at a temperature of 780° C. to 830° C. and a pressure of 2 mTorr to 3.5 mTorr. The lower oxide film ONO1 can be formed in thickness of 35 Å to 45 Å. The nitride film ONO2 can be formed using $SiH_2Cl_2$ and $NH_3$.

In order to prevent degradation in the properties of the lower oxide film ONO1 due to thermal stress in the process of lowering the temperature after the lower oxide film ONO1 is deposited, the temperature can be lowered at the rate of 10° C./minutes to 25° C./minutes. While the temperature is lowered as such, $N_2$ gas can be supplied to the reaction chamber.

Figure 2F:
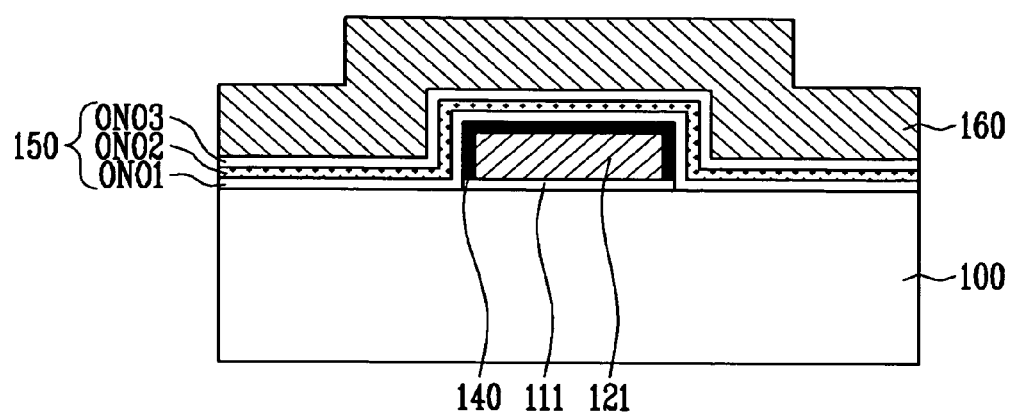

Next, as shown in FIG. 2F, a conductive film 160 for a control gate is formed on the dielectric layer 150. The conductive film can be formed using a silicon film. In addition, the conductive film can be formed by stacking a silicide film or a metal on the silicon film.

Figure 2G:
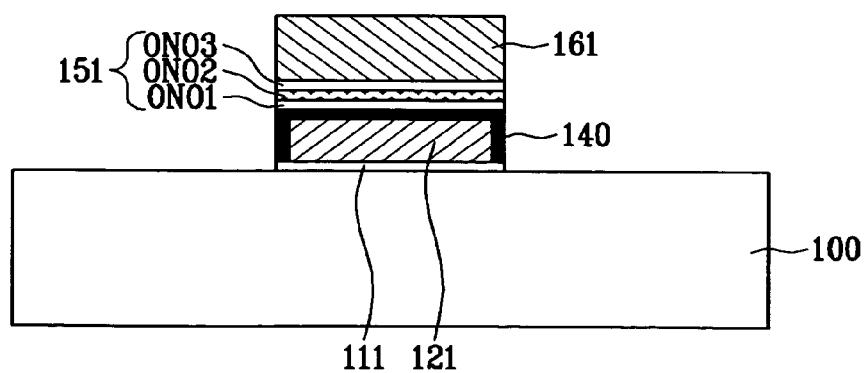

Thereafter, the conductive film 160 and the dielectric layer 150 are patterned to form a control gate 161 and a dielectric layer pattern 151, as shown in FIG. 2G.

Figure 2H:
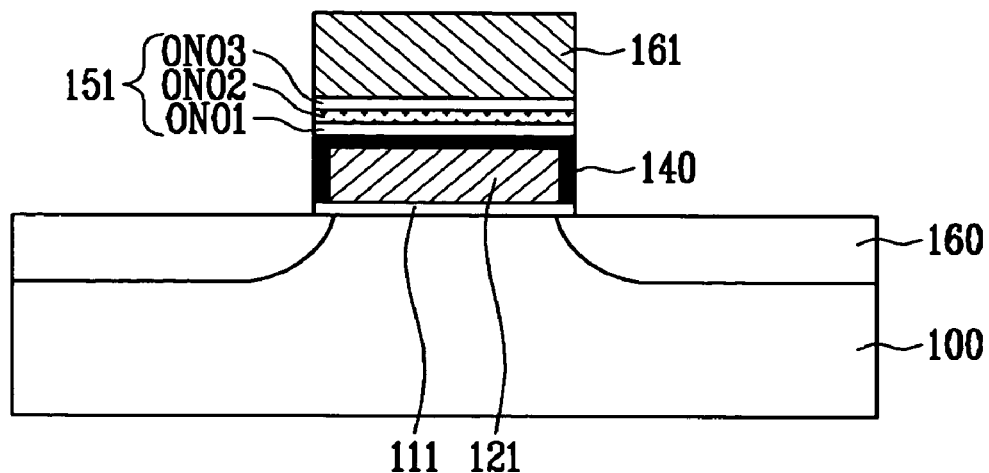

As shown in FIG. 2H, source/drain 170 is formed in the semiconductor substrate 100. An annealing process is then performed.

Diffusion of oxygen atoms that occurs in the annealing process is in proportional to the fineness of the interface between the silicon film pattern 121 and the lower oxide film ONO1. By forming the Si—F bonding layer 130 on the surface of the silicon film pattern 121 according to the present invention, it is possible to prevent the native oxide film from being generated on the surface of the silicon film pattern 121, increasing the fineness. Furthermore, the reaction between the diffused oxygen atoms and the surface of the silicon film pattern 121 is precluded by the Si—N bonding layer 140, thereby preventing the thickness of the lower oxide film ONO1 from increasing. Accordingly, variation in the threshold voltage for programming and erasing of the device can be kept within 0.2 V to 0.4 V. Moreover, the interfacial properties of the floating gate and the dielectric layer are improved to improve the breakdown voltage (BV) properties of the lower oxide film ONO1 by 10% to 30%.

A method for manufacturing a flash memory device according to another embodiment of the present invention will be described with reference to FIG. 3A to FIG. 3C.

Figure 3A:
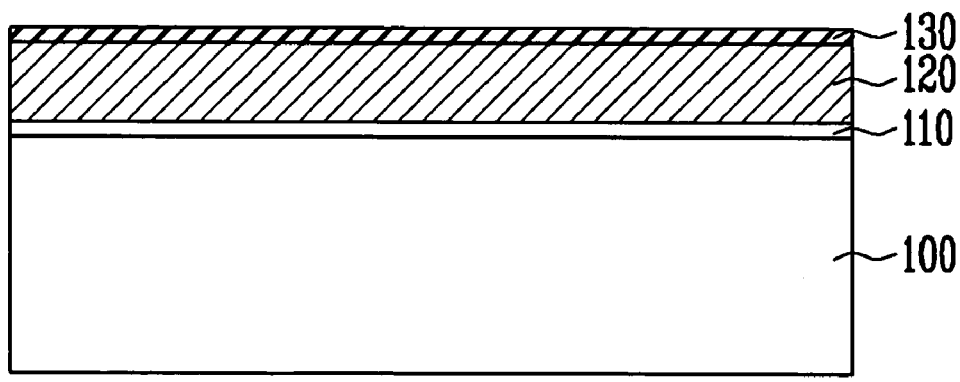
FIG. 3A to FIG. 3C are cross-sectional views shown to explain a method for manufacturing a flash memory device according to an embodiment of the present invention.
Figure 3B:
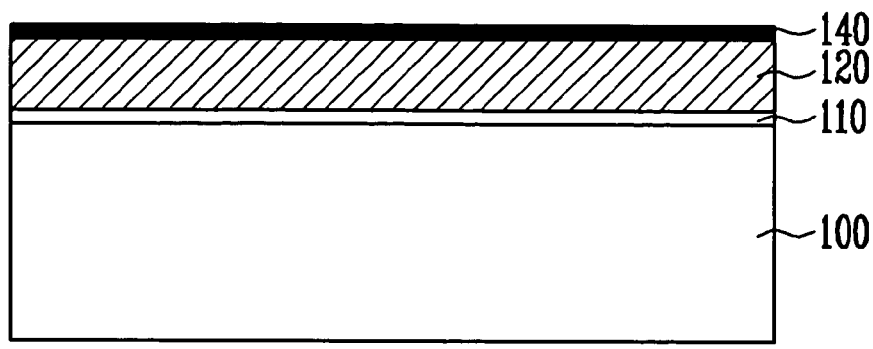

As shown in FIG. 3A, a tunnel oxide film 110 and a silicon film 120 for a floating gate are sequentially formed on a semiconductor substrate 100. In an atmosphere that fluorine is supplied, a Si—F bonding layer 130 is formed on the surface of the silicon film 120. The Si—F bonding layer 130 can be formed by means of a cleaning process using a HF solution.

The semiconductor substrate 100 in which the Si—F bonding layer 130 is completely formed is then moved into a reaction chamber. An annealing process is then carried out in a nitrogen atmosphere, thus forming a Si—N bonding layer 140 on the surface of the silicon film 120, as shown in FIG. 3B.

Figure 3C:
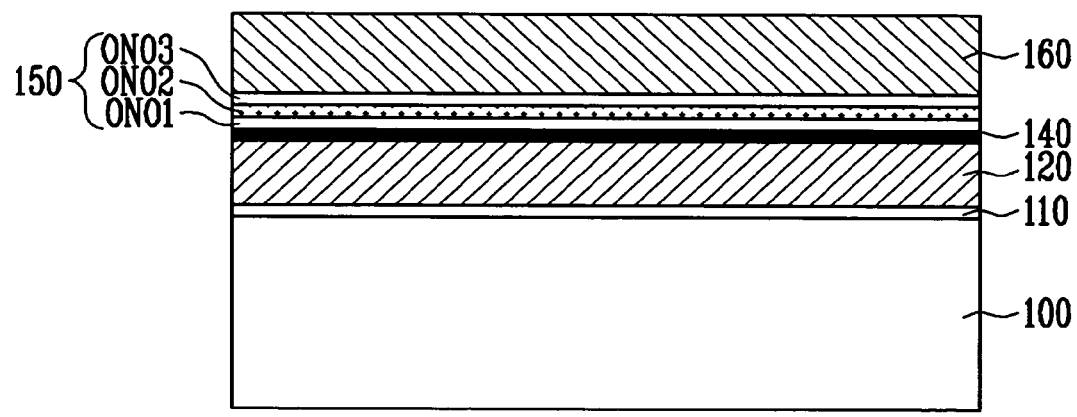

As shown in FIG. 3C, a dielectric layer 150 having at least oxide film and a conductive film 160 for a control gate are sequentially formed on the silicon film 120 having the Si—N bonding layer 140. The dielectric layer 150 can be formed by stacking a lower oxide film ONO1, a nitride film ONO2 and an upper oxide film ONO3. The Si—N bonding layer 140 and the dielectric layer 150 can be formed in-situ.

Next, the conductive film 160, the dielectric layer 150 and the silicon film 120 having the Si—N bonding layer 140 are patterned to form a control gate 161, a dielectric layer pattern 151, a silicon film pattern 121 having the Si—N bonding layer 140 and a tunnel oxide film pattern 111, as shown in FIG. 2G.

A subsequent process such as forming source/drain is performed.

According to the present invention, it is possible to prevent an increase in a thickness of a dielectric layer between a floating gate and a control gate in the annealing process. It is also possible to prevent the bird's beak that the edges of the dielectric layer from becoming thick. Accordingly, as the coupling properties between the floating gate and the control gate are improved, distribution of the threshold voltage in the programming and erasing operation of a device can be significantly reduced. It is thus possible to significantly improve the yield. Meanwhile, the narrower the line width of a gate, the greater the effect depending on generation of the bird's beak. The present invention can prohibit generation of the bird's beak effectively and contribute to an increase in the yield of a high-integration flash memory device.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a flash memory device, comprising the steps of:
    forming a silicon film pattern constituting a floating gate;
    forming a silicon-fluorine (Si—F) bonding layer on the surface of the silicon film pattern in an atmosphere that fluorine is supplied;
    performing an annealing process in a nitrogen atmosphere, thus forming a silicon-nitrogen (Si—N) bonding layer on the surface of the silicon film pattern;
    forming a dielectric layer having at least one oxide film on the silicon film pattern having the Si—N bonding layer; and
    forming a conductive film for forming a control gate on the dielectric layer.

2. The method as claimed in claim 1, wherein the Si—F bonding layer is formed using a HF solution.

3. The method as claimed in claim 2, further comprising the steps of, after the step of forming the silicon film pattern, performing cleaning using a mixed solution of $H_2SO_4$, $H_2O_2$ and $H_2O$;
    performing cleaning using a mixed solution of $NH_4F$ and HF; and
    performing cleaning using a mixed solution of $NH_4OH$, $H_2O_2$ and $H_2O$.

4. The method as claimed in claim 1, wherein the Si—N bonding layer is formed by performing an annealing process in a $NH_3$ gas atmosphere.

5. The method as claimed in claim 4, wherein the step of forming the Si—N bonding layer and the step of forming the dielectric layer are performed in-situ.

6. The method as claimed in claim 5, wherein the dielectric layer is formed by stacking a lower oxide film, a nitride film and an upper oxide film on the silicon film pattern having the Si—N bonding layer.

7. The method as claimed in claim 6, wherein the silicon film is formed using an amorphous silicon film.

8. The method as claimed in claim 7, wherein the silicon film is formed using an amorphous silicon film into which phosphorous (P) is doped.

9. A method of manufacturing a flash memory device, comprising the steps of:
    forming a silicon film for forming a floating gate;
    forming a silicon-fluorine (Si—F) bonding layer on the surface of the silicon film in an atmosphere that fluorine is supplied;
    performing an annealing process in a nitrogen atmosphere, thus forming a silicon-nitrogen (Si—N) bonding layer on the surface of the silicon film;
    forming a dielectric layer having at least one oxide film on the silicon film having the Si—N bonding layer;
    forming a conductive film for forming a control gate on the dielectric layer; and
    patterning the silicon film having the conductive film, the dielectric layer and the Si—N bonding layer.

10. The method as claimed in claim 9, wherein the Si—F bonding layer is formed using a HF solution.

11. The method as claimed in claim 9, wherein the Si—N bonding layer is formed by performing an annealing process in a $NH_3$ gas atmosphere.

12. The method as claimed in claim 11, wherein the step of forming the Si—N bonding layer and the step of forming the dielectric layer are performed in-situ.

13. The method as claimed in claim 9, wherein the dielectric layer is formed by stacking a lower oxide film, a nitride film and an upper oxide film on the silicon film having the Si—N bonding layer.

14. A method of manufacturing a flash memory device, comprising the steps of:
    forming a silicon film pattern constituting a floating gate;
    performing a cleaning process using HF, thus forming a Si—F bonding layer on the surface of the silicon film pattern;
    performing an annealing process in a $NH_3$ gas atmosphere to form a Si—N bonding layer on the surface of the silicon film pattern;
    stacking a lower oxide film, a nitride film and an upper oxide film on the silicon film pattern having the Si—N bonding layer, thus forming a dielectric layer; and
    forming a control gate on the dielectric layer.

15. The method as claimed in claim 14, further comprising the steps of, after the step of forming the silicon film pattern, performing cleaning using a mixed solution of $H_2SO_4$, $H_2O_2$ and $H_2O$;
    performing cleaning using a mixed solution of $NH_4F$ and HF; and
    performing cleaning using a mixed solution of $NH_4OH$, $H_2O_2$ and $H_2O$.

* * * * *